United States Patent [19]

Kurihara et al.

[11] 4,310,803
[45] Jan. 12, 1982

[54] BANDPASS FILTER CIRCUIT

[76] Inventors: Hiroshi Kurihara, 2-15, Umesato 2-chome, Suginami-ku, Tokyo 166; Sadao Takenaka, 3-15, Shinsugita-cho, Isogo-ku, Yokohama-shi, Kanagawa 235, both of Japan

[21] Appl. No.: 68,004

[22] Filed: Aug. 20, 1979

[30] Foreign Application Priority Data

Aug. 23, 1978 [JP] Japan .................................. 53-102586

[51] Int. Cl.³ .......................................... H03H 11/02
[52] U.S. Cl. .................................... 328/167; 328/138; 328/155
[58] Field of Search .................... 328/55, 25, 56, 155, 328/167

[56] References Cited

U.S. PATENT DOCUMENTS

| 3,493,876 | 2/1970 | Zimmerman | 328/167 |
| 3,602,824 | 8/1971 | Rusch | 328/25 |
| 4,095,185 | 6/1978 | Winters | 328/55 |

Primary Examiner—Paul L. Gensler

[57] ABSTRACT

An improved bandpass filter circuit for selecting a relatively narrow band portion of an input sinusoidal signal. The improved bandpass filter circuit produces an output signal whose phase deviation from the input signal is substantially constant for small variations in the frequency of the input signal. The improved bandpass filter circuit in accordance with the present invention does not use feedback control in its operation and therefore is free from the inherent delay time of a tracking type bandpass filter utilizing feedback control in handling transitory input signals.

12 Claims, 11 Drawing Figures

BANDPASS FILTER CIRCUIT

BACKGROUND OF THE INVENTION

This invention relates to an improvement of the phase characteristics of a bandpass filter which is used to select a signal component from a wideband frequency spectrum.

In general, the phase difference between the input and output of a bandpass filter for an input frequency within the filter passband is not constant but instead is frequency dependent. This is illustrated in FIG. 1 of the drawings.

In FIG. 1, the X axis represents frequency, while the Y axis represents attenuation and phase. The solid line shows the attenuation characteristic of a typical bandpass filter and the dotted line shows its phase characteristic. In addition, $f_{-1}$ and $f_1$ are the lower and upper filter cut-off frequencies, and $f_o$ defines the filter's center frequency.

As shown in FIG. 1, as the input frequency becomes far from the center frequency $f_o$, a phase deviation between the input and output signals increases. The increasing phase deviation becomes significant as the bandwidth of a bandpass filter is reduced. Therefore, when it is necessary to maintain a constant phase relationship between the input and output signals in a circuit where the signal component is selected by means of a narrow bandwidth bandpass filter, the input frequency and the center frequency of a bandpass filter should always coincide.

A bandpass filter having such requirements is widely used for a data transmission system where the synchronization signal or carrier is selected at the correct phase (e.g.—for data transmission by means of a PSK modulation system).

A carrier recovery circuit for 4-phase PSK system is shown in FIG. 2 as an example.

As illustrated in FIG. 2, the 4-phase PSK signal is quadrupled by the frequency multiplier 21. Then, the noise component is reduced by the narrow band bandpass filter 22. Thereafter, the resultant signal is divided by 4 by the frequency divider 23. Thus, the carrier signal is extracted.

In the above-noted method, it is necessary to substantially eliminate the noise component included in the output of multiplier 21 and on the other hand it is also necessary to keep the phase deviation small because such a phase deviation between the input and output signals of the bandpass filter 22 will deteriorate the system performance if the input signal frequency changes.

For this reason, a tracking type filter is usually employed. In the tracking type filter shown in FIG. 3, the phase difference between the input and output signals of a bandpass filter 32 is detected by a phase detector 34. A voltage corresponding to the detected phase difference is transmitted from the phase detector 34 to a local oscillator 36 via a loop filter 35, thereby causing the oscillation frequency of the local oscillator 36 to be changed so that the center frequency $f_o$ of the bandpass filter 32 and the frequency f of the input signal to the bandpass filter 32 coincide.

However, such a tracking type filter has a problem in that the tracking of the transitionary input signal is delayed because of the feedback control.

SUMMARY OF THE INVENTION

An object of the present invention is to provide a bandpass filter which does not cause a change in the phase difference between input and output signals if the input signal frequency changes. The bandpass filter functions without the inherent problems of prior art tracking filters utilizing feedback control.

DESCRIPTION OF THE PREFERRED EMBODIMENTS

In a bandpass filter in accordance with the present invention, an input signal is split into two paths. The frequencies of the two separate path signals are made different by the use of separate frequency multiplier or dividing means in each path. Simultaneously, the phase variations of two divided path signals are kept equal. Then, the frequency difference of two divided path signals is extracted by means of a frequency multiplier.

The present invention will be explained in detail on the basis of the given drawings.

Figure 4:
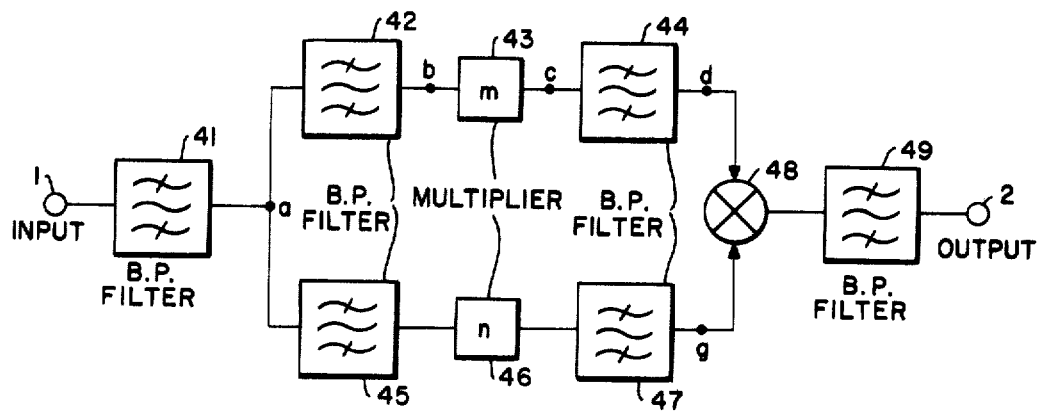
FIG. 4 shows a basic circuit of a bandpass filter in accordance with the present invention.

FIG. 4 shows a basic circuit of the present invention. In the figure, element 1 is the signal input terminal; element 2 is the signal output terminal; elements 41, 42, 44, 45, 47 and 49 are bandpass filters.

Elements 43 and 46 are frequency multipliers or dividers (the ratio between the output signal frequency and input signal frequency is defined as m and n respectively). When elements 43 and 46 are multipliers, ratios m and n become integers but when elements 43 and 46 are dividers, ratios m and n become fractions.

Element 48 is a multiplier which extracts the sum or difference frequency component from the product of two input signals. In FIG. 4, the two paths from branching point a to the multiplier 48 are respectively named, as the first and second paths. The first path includes the point d, while the second path includes the point g.

A normalized input signal to the input terminal 1 is expressed by the following:

$$\sin \omega t \qquad (1)$$

The center angular frequency of the bandpass filters 41, 42 and 45 is defined to be $\omega_o$; the center angular frequencies of the bandpass filters 44, 47 and 49 are respectively defined to be $m\omega_o$, $n\omega_o$ and $(m-n)\omega_o$.

In general, when it is assumed that the output phase $\theta$ of a bandpass filter linearly changes for the input angular frequency $\omega$ in the vicinity of the center angular frequency $\omega_o$ of the bandpass filter, the output phase can be approximated as a product of the angular frequency difference $\Delta\omega = \omega_o - \omega$ and group delay time $\tau$.

Namely,
$$\theta \approx \Delta\omega\tau \tag{2}$$

Therefore, the signal at the point b of FIG. 4 can be expressed as follows when the input signal frequency is detuned since the phase deviation is generated by the bandpass filters 41 and 42:

$$\sin\{\omega t + \Delta\omega(\tau_1 + \tau_2)\} \tag{3}$$

Here, $\tau_1$ and $\tau_2$ are group delay times of the bandpass filters 41 and 42. $\omega_o - \omega$ is expressed as $\Delta\omega$ and $\omega$ is the angular frequency of the input signal.

When the signal expressed by equation (3) is multiplied or divided by element 43, both frequency and phase are multiplied by m and the signal at point c is expressed as follows:

$$\sin\{m\omega t + m\Delta\omega(\tau_1 + \tau_2)\} \tag{4}$$

This signal generates a phase deviation by the bandpass filter 44 and the signal at the point d can be expressed as follows:

$$\sin\{m\omega t + m\Delta\omega(\tau_1 + \tau_2 + \tau_3)\} \tag{5}$$

Here, $\tau_3$ is a group delay time of the bandpass filter 44. Similarly the signal at the point g can be expressed as follows:

$$\sin\{n\omega t + n\Delta\omega(\tau_1 + \tau_4 + \tau_5)\} \tag{6}$$

Here, $\tau_4$ and $\tau_5$ are group delay times of the bandpass filters 45 and 47.

The signals appearing at the point d and g are multiplied by the multiplier 48.

The output of multiplier 48 is the sum and difference frequency components of the input signals and the difference frequency component can be expressed by the following:

$$\cos\{(m-n)\omega t + m\Delta\omega(\tau_1 + \tau_2 + \tau_3) - n\Delta\omega(\tau_1 + \tau_4 + \tau_5)\} \tag{7}$$

When this signal passes through bandpass filter 49, the signal at the output terminal 2 can be expressed as follows:

$$\cos\{(m-n)\omega t + m\Delta\omega(\tau_1 + \tau_2 + \tau_3) - n\Delta\omega(\tau_1 + \tau_4 + \tau_5) + (m-n)\Delta\omega\tau_6\}$$
$$= \cos\{(m-n)\omega t + m\Delta\omega(\tau_1 + \tau_2 + \tau_3 + \tau_6) - n\Delta\omega(\tau_1 + \tau_4 + \tau_5 + \tau_6)\}$$

Here, $\tau_6$ is the group delay time of the bandpass filter 49.

The condition that the phase of the output of the circuit shown in FIG. 4 is free from the effect of variations in input frequency can be expressed by equations (8) or (9) from the condition that the phase component of equation (8) becomes zero.

$$m(\tau_1 + \tau_2 + \tau_3 + \tau_6) = n(\tau_1 + \tau_4 + \tau_5 + \tau_6) \tag{9}$$

or $$m/n = (\tau_1 + \tau_4 + \tau_5 + \tau_6)/(\tau_1 + \tau_2 + \tau_3 + \tau_6) \tag{10}$$

Equation (10) states that the frequency ratio of the two paths is equal to the total sum of the group delay times from the input to the output via two routes.

To explain the present invention as a general case, the basic circuit as shown in FIG. 4 comprises all of the possible bandpass filters. However it will be subsequently explained that only two bandpass filters are necessary to produce a bandpass filter in accordance with the present invention.

Defining $m/n = K$, the following relationship can be obtained from the equation (10):

$$\tau_4 + \tau_5 = (k-1)(\tau_1 + \tau_6) + k(\tau_2 + \tau_3) \tag{11}$$

As understood from (7), the two input frequencies to the multiplier 48 must be different in order to obtain a difference frequency component of the output of said multiplier which is not a DC signal.

When the output frequency of the second path is lower than the output frequency of the first path, $K > 1$. Therefore, from the equation (11), $$(\tau_4 + \tau_5) > 0 \tag{12}$$

If a bandpass filter is used as a means for giving a time delay, equation (12) states that it is necessary to use a bandpass filter for the lower frequency path. It is necessary to insert another bandpass filter in the path other than the path in which the first bandpass filter is inserted so that equation (9) or (10) is satisfied.

Figure 5:
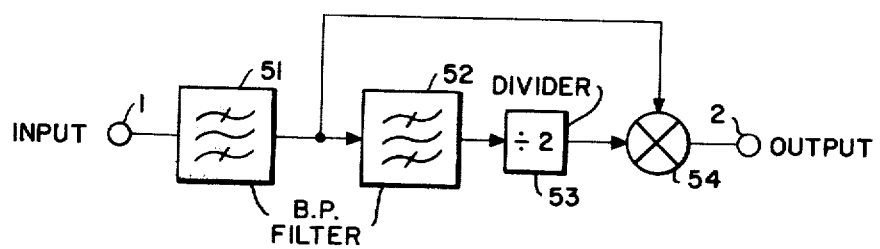
FIG. 5 shows a first embodiment of a bandpass filter in accordance with the present invention.

The present invention will be explained below by referring to the most simplified circuit. FIG. 5 shows an example of such simplified circuit.

In FIG. 5, elements 51 and 52 are bandpass filters having similar characteristics. Element 53 is a divide by two frequency divider. Element 54 is a frequency multiplier. It is assumed that a phase deviation of $\theta$ is respectively generated by these bandpass filters because the input signal appearing at the input terminal 1 is detuned from the center frequencies of the bandpass filters 51 and 52. The frequency and phase are reduced by half by the divider 53, although phase deviation at the input of the divider 53 is $2\theta$. The divider output can be expressed as follows:

$$\sin(\omega t/2 + \theta) \tag{13}$$

where an input to the terminal 1 is assumed to be $\sin \omega t$. This signal is one input of multiplier 54 and the output of the bandpass filter 51, (the signal expressed below), is the other input of said multiplier.

$$\sin(\omega t + \theta) \tag{14}$$

At the output of multiplier 54, the product of said two inputs, namely:

$$\sin(wt+\theta)\sin\left(\frac{wt}{2} + \theta\right) = \tfrac{1}{2}\cos\frac{wt}{2} - \tfrac{1}{2}\cos\left(\tfrac{3}{2}wt + 2\theta\right)$$

appears.

The first term to the right of the equal sign of equation (15) is the difference frequency component, while the second term is the sum frequency component. Since these components are different in frequency, either one can be easily isolated.

When centered on the difference frequency component, the phase deviation generated by bandpass filters 51 and 52 does not appear in the output.

If the dividing ratio of the divider 53 is assumed to be 1/N where N is an integer not less than two, the ratio of the group delay times of the bandpass filter 52 and 51 ($\tau_4/\tau_1$) must be N-1. This is obtained from equation (9) by letting m=1, n=1/N and $\tau_2=\tau_3=\tau_5=\tau_6=0$.

Figure 6:
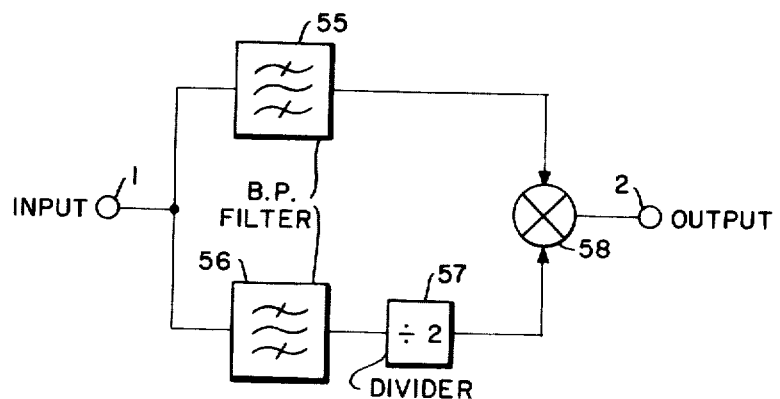
FIG. 6 shows a second embodiment of a bandpass filter in accordance with the present invention.

FIG. 6 shows a modification of the circuit shown in FIG. 5. In this figure, elements 55, 56 are bandpass filters, element 57 is a divide by two frequency divider and element 58 is a frequency multiplier.

If the phase deviation of bandpass filter 55 is set to $\theta$ and that of bandpass filter 56 is set to $2\theta$, the input to multiplier 58 becomes similar to that of the circuit shown in FIG. 5. Therefore, a phase deviation does not appear at the output.

In the circuits shown in FIG. 5 and FIG. 6, a bandpass filter for isolating the sum frequency component and difference frequency component is required for the output stage. But, in general, this additional bandpass filter has sufficiently wide bandwidth as compared with that of the above-mentioned bandpass filters 51, 52, 55 and 56 and for this reason its phase deviation is very little. Thus, it is not illustrated in FIGS. 5 and 6 for the convenience of explanation.

The ratio of group delay time of the bandpass filters 56 and 55, ($\tau_4/\tau_3$) must be equal to N when the dividing ratio of the divider 57 is assumed to be 1/N as a general case. This is obtained from equation (9) by letting m=1, n=1/N and $\tau_1=\tau_3=\tau_5=\tau_6=0$.

Figure 1:
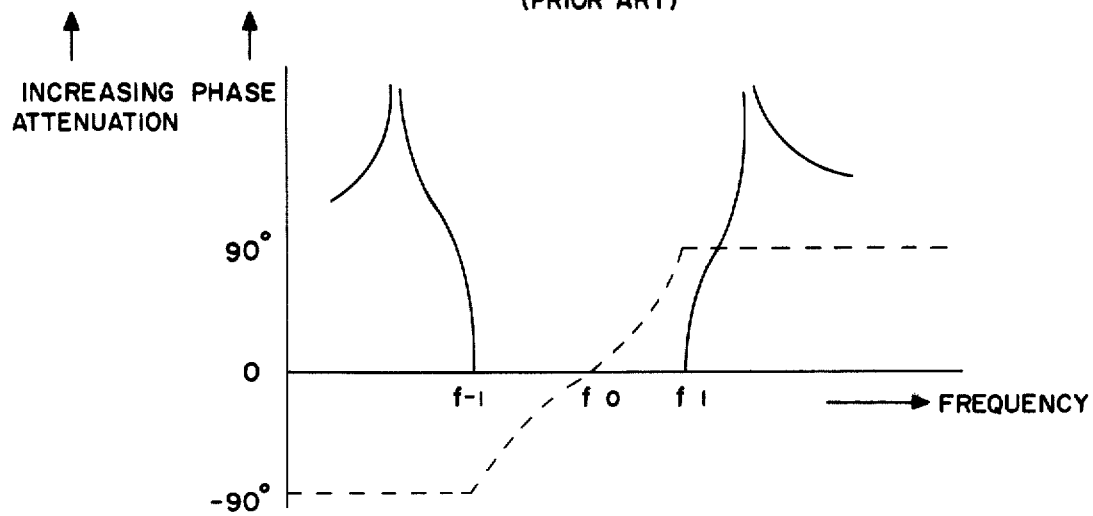
FIG. 1 shows the attenuation characteristic and phase characteristic of a prior art bandpass filter.
Figure 2:
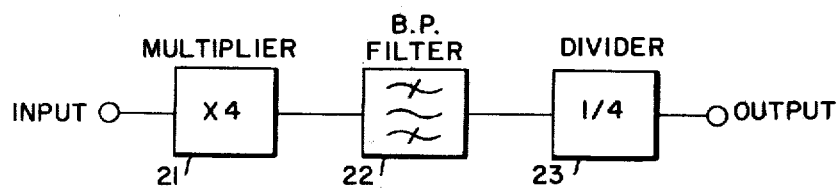
FIG. 2 shows a prior art carrier extraction circuit.
Figure 3:
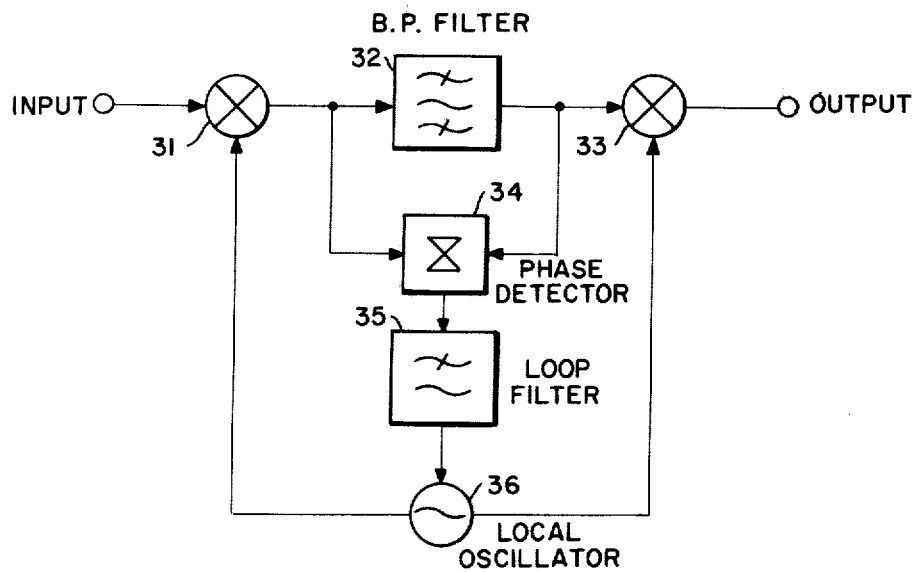
FIG. 3 shows a prior art tracking type bandpass filter.

In FIG. 5 or FIG. 6 the frequency of the output signal is half that of the input signal, but it is convenient to apply such a process to the circuit for recovering the carrier from the PSK modulated signal shown in FIG. 2 because in such a circuit the frequency of the bandpass filter output is divided.

Figure 7:
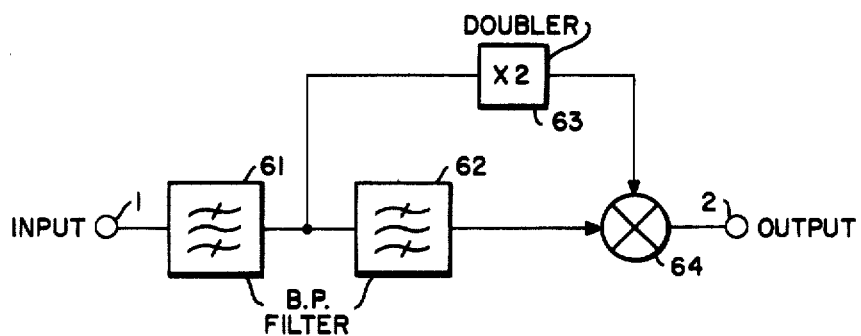
FIG. 7 shows a third embodiment of a bandpass filter in accordance with the present invention.

However, in case it is necessary to keep constant the input and output frequencies, the output in FIG. 5 and FIG. 6 should be doubled or the circuit should be configured as shown in FIG. 7. In the figure, elements 61 and 62 are bandpass filters and element 63 is a frequency doubler, while element 64 is a multiplier.

When the phase deviation of the bandpass filters 61, 62 are assumed to be $\theta$, the output of the bandpass filter 62 has a phase deviation of $2\theta$. Also, the phase deviation of the output of the double 63 becomes $2\theta$ and its frequency is doubled.

Therefore, if an input signal to the terminal 1 is assumed to be sin $\omega t$, the output of the bandpass filter 62 becomes sin ($\omega t=2\theta$), while the output of the doubler 63 becomes sin ($2\omega t+2\theta$).

When these two input signals are input to the multiplier 64, the output signal can be expressed as follows:

$$\sin(2\omega t+2\theta)\sin(\omega t+2\theta)=\tfrac{1}{2}\cos\omega t-\tfrac{1}{2}\cos(3\omega t+4\theta) \quad (16)$$

Therefore, as was previously described, when centering only on the first term to the right of the equal signa in equation (16), the phase deviation between the input and output is zero and the frequency of the input and output signals are equal.

If the multiplier ratio of the multiplier 63 is assumed to be M, where M is an integer not less than two, the ratio of the group delay times of the bandpass filters 62 and 61 ($\tau_4/\tau_1$) must be M-1. This is obtained from equation (9) by letting m=M, n=1 and $\tau_2=\tau_3=\tau_5=\tau_6=0$.

Figure 8:
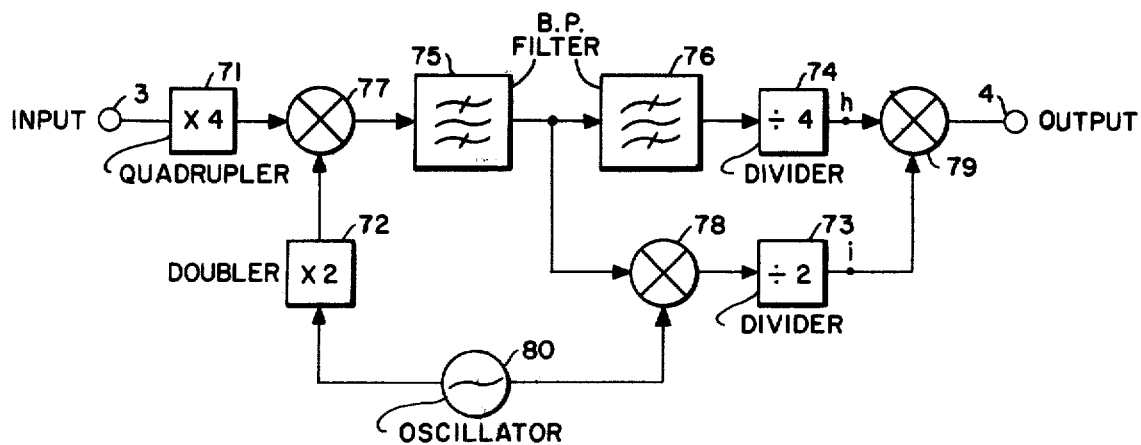
FIG. 8 shows a fourth embodiment of a bandpass filter in accordance with the present invention.

The fourth embodiment in accordance with the present invention as applied to a circuit for extracting the carrier signal from a 4-phase PSK modulated signal will be explained by referring to FIG. 8. In this embodiment, the frequency of the input signal to the bandpass filter is kept low by using a frequency converter, thereby simplifying the circuit structure. In FIG. 8, element 71 is a frequency quadrupler; element 72 is a frequency doubler; element 73 is a divide by two frequency divider; element 74 is a divide by four frequency divider; elements 75 and 76 are bandpass filters; elements 77 and 78 are frequency converters; element 79 is a frequency multiplier; element 80 is an oscillator which oscillates at 100 MHz, for example. It is assumed that the 4-phase PSK modulated signal with a center frequency of 70 MHz, for example, is input to the input terminal 3. First, the frequency of the input signal is multiplied by 4 times up to 280 MHz by the multiplier 71 in order to eliminate its unwanted modulation components.

The 280 MHz component is then frequency converted to 80 MHz by the frequency converter 77; then the noise component is eliminated by the bandpass filter 75. The local oscillator frequency of 200 MHz used to obtain the 80 MHz signal can be obtained by multiplying the 100 MHz signal from oscillator 80 utilizing multiplier 72. If the center frequency of the bandpass filter 75 is somewhat detuned from 80 MHz, a phase error $\theta_1$ proportional to such detuning is generated.

The output of the bandpass filter 75 is divided into two paths. One signal path passes through bandpass filter 76 and is frequency divided by a factor of four by divider 74 and thereafter enters the multiplier 79 at point h. In the other path, the signal is converted up to 180 MHz by being added to the 100 MHz signal from oscillator 80 by means of frequency converter 78, and then enters the multiplier 79 after its frequency is halved by divider 73.

Thus, the frequency and phase of the signal at point h respectively become 20 MHz and $(\theta_1+\theta_2)/4$, (where $\theta_2$ is a phase variation generated by the bandpass filter 76). The frequency at point i is 90 MHz while the phase is $\theta_1/2$. If it is assumed that the frequency difference between the points h and i is extracted, from the output of multiplier 79, then a sine wave having a frequency of 70 MHz and a phase of $(\theta_1-\theta_2)/4$ can be obtained as the output. Therefore, a carrier signal having no phase deviation due to the filter 75 can be extracted from output terminal 4 of FIG. 8 by using two bandpass filters 75 and 76 selected such that $\theta_1=\theta_2$.

Figure 9:
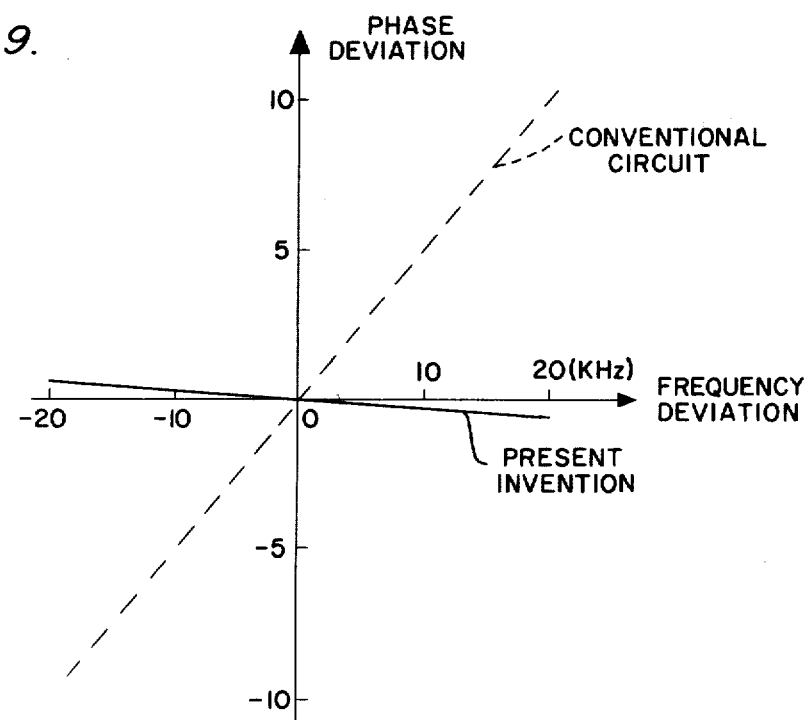
FIG. 9 shows the characteristics of the embodiment shown in FIG. 8 in comparison to the characteristics of a conventional filter circuit.

FIG. 9 shows the characteristics of the circuit shown in FIG. 8. For comparison, the characteristics of a conventional circuit utilizing only the bandpass filter 75 is also shown.

In the figure, a solid line indicates the characteristics of the circuit shown in FIG. 8 and a dotted line indicates the characteristics of the conventional circuit. The X axis represents frequency deviation and the Y axis represents phase deviation.

As is clear from the figure, in the case of the conventional circuit the phase deviation is $\pm 10$ degrees when the frequency is shifted by $\pm 20$ kHz from the center frequency. However, utilizing a circuit in accordance with the present invention results in a phase deviation of only $\pm 0.5$ degree. This small residual phase difference is due to a difference in the phase characteristic of the actual realizable bandpass filters 75 and 76 used for the experiment. If the bandpass filter characteristics coincide, the resultant phase deviation would be equal to zero.

In the above explanation to bandpass filters are used. A similar effect can also be obtained by using a delay line as a means for providing a time delay. Thus, delay lines may be used instead of the bandpass filters shown in FIG. 4. The reason is that the output phase $\theta$ of a delay line as well as that of a bandpass filter linearly changes as follows:

$$\theta = -\omega\tau = \Delta\omega\tau - \omega_o\tau \quad (17)$$

The second term of equation (17) is constant, so that equation (2) and (17) are the same so far as the phase deviation due to input frequency change is concerned. Another embodiment of the present invention in which a delay line is used instead of a bandpass filter will be explained by referring to FIG. 10 as the most simplified example.

Figure 10:
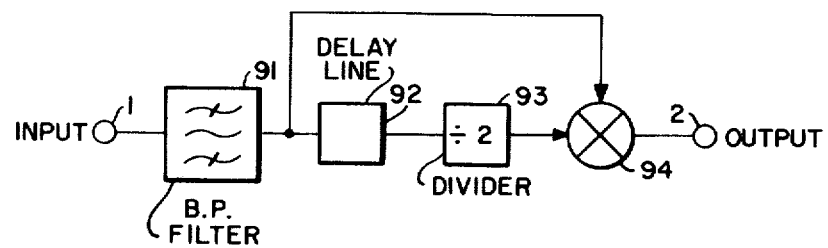
FIG. 10 shows a fifth embodiment of a bandpass filter in accordance with the present invention.

In FIG. 10, element 91 is bandpass filter; element 92 is a delay line; element 93 is a divide by two frequency divider; element 94 is a multiplier.

In this circuit, the delay line 92 is used in place of the bandpass filter 52 of FIG. 5.

When the group delay time of the band pass filter 91 is assumed to be $\tau_1$, the delay time of the delay line 92 assumed tp be $\tau_4$, and an input signal at terminal 1 assumed to sin $\omega t$, the two inputs of the multiplier 94 are respectively expressed as:

$$\sin(\omega t + \Delta\omega\tau_1) \quad (18)$$

and $$\sin\{\tfrac{1}{2}\omega(t-\tau_4)+\tfrac{1}{2}\Delta\omega\tau_1\} \quad (19)$$

As in the case of the above-mentioned method, the following output can be obtained by extracting the subtracting one frequency component from the output of multiplier:

$$\cos\{\tfrac{1}{2}\omega t + \tfrac{1}{2}\Delta\omega\tau_1 + \tfrac{1}{2}\omega\tau_4\} = \cos\{\tfrac{1}{2}\omega\tau + \tfrac{1}{2}\omega(\tau_4-\tau_1)+\tfrac{1}{2}\omega_o\tau_1\} \quad (20)$$

Therefore, when $\tau_1 = \tau_4$, the phase variation becomes zero even if the frequency of the input signal changes.

In this case, the delay time ratio of the delay line 92 and bandpass filter 91 must be proportional to N-1 as in the case of FIG. 5 when the dividing ratio of the divider 93 is assumed to be 1/N.

Figure 11:
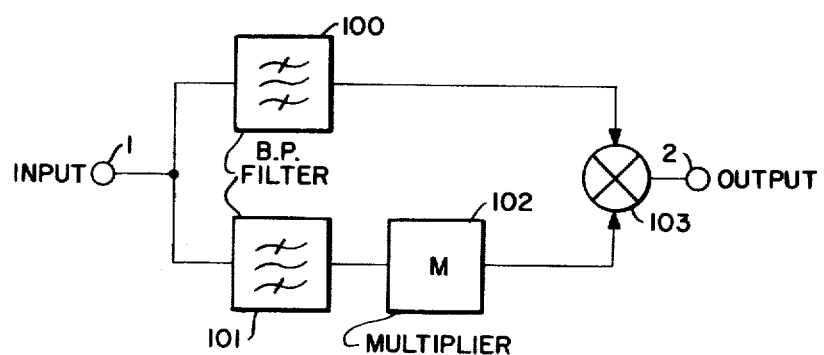
FIG. 11 shows a sixth embodiment of a bandpass filter in accordance with the present invention.

FIG. 11 shows another embodiment of the present invention. The figure is a modification of the embodiment shown in FIG. 6 and the multiplier 102 is used in place of the divider 57. Elements 100 and 101 are bandpass filters.

The phase deviation ratio or delay time ratio of the bandpass filters 100 and 101 in this circuit must be approximately equal to the multiplication ratio M of the multiplier 102. The reason will be clear from the above description.

As will be understood from the above explanation, the present invention provides a bandpass filter having no phase deviation change between the input and output signals due to a change of the input signal frequency. Furthermore, such a filter may be provided without the use of a feedback control means.

Thus, the resultant circuit structure is simplified and simultaneously the disadvantage of the prior tracking type filter, (i.e.-the problem that a delay occurs in the tracking time for a transitionary input signal), can be solved.

While the invention has been particularly shown and described with reference to preferred embodiments thereof, it will be understood by those skilled in the art that various changes in form and details may be made therein without departing from the spirit and scope of the invention.

We claim:

1. A bandpass filter circuit comprising:
   an input terminal for receiving an input signal;
   a first bandpass filter having a group delay time $T_1$ operatively connected to said input terminal;
   second and third bandpass filters having group delay times $T_2$ and $T_3$ respectively operatively connected to the output of said first bandpass filter;
   first and second frequency multipliers respectively operatively connected to the outputs of said second and third bandpass filters and having multiplication ratios of m and n respectively;
   fourth and fifth bandpass filters having group delay times $T_4$ and $T_5$ respectively operatively connected to the outputs of said first and second multipliers respectively;
   a multiplier means operatively connected to the outputs of said fourth and fifth bandpass filters for multipling the outputs of said fourth and fifth bandpass filters;
   a sixth bandpass filter having a group delay time $T_6$ operatively connected to the output of said multiplier means;
   an output terminal operatively connected to the output of said sixth bandpass filter for outputting the output of said sixth bandpass filter;
   wherein the group delay times of said bandpass filters and the multiplication ratios of said first and second multipliers are preselected to meet the following equation:

$$m/n = (T_1 + T_3 + T_5 + T_6)/(T_1 + T_2 + T_4 + T_6),$$

whereby the phase difference between a sinusoidal input signal present at said input terminal and the resultant sinusoidal outpt signal present at said output terminal remains substantially constant for small deviations in the frequency of said input signal.

2. A bandpass filter circuit as in claim 1, wherein said group delay times $T_2$, $T_4$, $T_5$ and $T_6$ equal zero, said multiplication ratio m equals 1, and said multiplication n equals $\tfrac{1}{2}$.

3. A bandpass filter circuit as in claim 1, wherein said group delay times $T_1$, $T_4$, $T_5$ and $T_6$ equal zero, said multiplication ratio m equals 1, and said multiplication n equals $\tfrac{1}{2}$.

4. A bandpass filter circuit as in claim 1, wherein said group delay times $T_2$, $T_4$, $T_5$, $T_6$ equal zero, said multiplication ratio m equals 2 and said multiplication ratio n equals 1.

5. A bandpass filter circuit as in claim 1, wherein said multiplication ratio m equals 1, said multiplication ratio n equals M, and said group delay times $T_1$, $T_4$, $T_5$ and $T_6$ equal zero.

6. A bandpass filter circuit comprising:
   an input terminal for receiving an input signal;
   a first bandpass filter having a group delay time $T_1$ operatively connected to said input terminal;
   second and third bandpass filters having group delay times $T_2$ and $T_3$ respectively operatively connected to the output of said first bandpass filter;

first and second frequency multipliers respectively operatively connected to the outputs of said second and third bandpass filters and having multiplication ratios of m and n respectively.

fourth and fifth bandpass filters having group delay times $T_4$ and $T_5$ respectively operatively connected to the outputs of said first and second multipliers respectively;

a multiplier means operatively connected to the outputs of said fourth and fifth bandpass filters for producing sum and difference frequency components from the outputs of said fourth and fifth bandpass filters;

a sixth bandpass filter having a group delay time $T_6$ operatively connected to the output of said multiplier means for extracting the difference frequency component of the output of said multiplier means;

an output terminal operatively connected to the output of said sixth bandpass filter for outputing the output of said sixth bandpass filter;

wherein the group delay times of said bandpass filters and the multiplication ratios of said first and second multipliers are preselected to meet the following equation:

$$m/n \approx (T_1+T_3+T_5+T_6)/(T_1+T_2+T_4+T_6),$$

whereby the phase difference between a sinusoidal input signal present at said input terminal and the resultant sinosoidal output signal present at said output terminal remains substantially constant for small deviations in the frequency of said input signal.

7. A bandpass filter circuit comprising:

an input terminal for receiving an input signal;

a first bandpass filter operatively connected to said input terminal and having a group delay time $T_1$;

a second bandpass filter operatively connected to the output of said first bandpass filter and having a group delay time $T_2$;

a frequency divider operatively connected to the output of said second bandpass filter and having a frequency dividing ratio 1/N;

a multiplier means operatively connected to the outputs of said first bandpass filter and said frequency divider for producing sum and difference frequency components of the outputs of said first bandpass filter and said divider means;

a third bandpass filter operatively connected to the output of said multiplier means for extracting the difference frequency component from the output of said multiplier means;

an output terminal operatively connected to the output of said third bandpass filter means for outputting the output of said third bandpass filter;

wherein the group delay time ratio $T_2/T_1$ is selected to be substantially N-1 to if N is an integer greater than 2; whereby the phase difference between a sinusoidal input signal present at said input terminal and the resultant sinusoidal output signal present at said output terminal is constant for small deviations in the frequency of said input signal.

8. A bandpass filter circuit comprising:

an input terminal for receiving an input signal, first and second bandpass filters operatively connected to said input terminal and having respective group delay times $T_1$ and $T_2$.

a frequency divider means operatively connected to the output of said second bandpass filter and having a frequency dividing ratio 1/N;

a multiplier means operatively connected to the output of said first bandpass filter and said frequency divider means for producing sum and difference frequency components of the outputs of said first bandpass filter and said frequency divider means;

a third bandpass filter operatively connected to the output of said multiplier means for extracting the difference frequency component from the output of said multiplier means;

an output terminal operatively connected to the output of said third bandpass filter means for outputting the output of said third bandpass filter;

wherein the group delay time ratio $T_2/T_1$ is selected to be substantially equal to N; whereby the phase difference between a sinusoidal input signal present at said input terminal and the resultant sinusoidal output signal represent at said output terminal is constant for small deviations in the frequency of said input signal.

9. A bandpass filter circuit comprising:

an input terminal for receiving an input signal;

a first bandpass filter operatively connected to said input terminal having a group delay time $T_1$;

a second bandpass filter operatively connected to the output of said first bandpass filter and having a group delay time $T_2$;

a frequency multiplier operatively connected to the output of said first bandpass filter and having a frequency multiplication ratio M;

a multiplier means operatively connected to the outputs of said second bandpass filter and said frequency multiplier for producing sum and difference frequency components of the outputs of said first bandpass filter and said frequency multiplier;

a third bandpass filter operatively connected to the output of said multiplier means for extracting the difference frequency component from the output of said multiplier means;

an output terminal operatively connected to the output of said third bandpass filter means for outputting the output of said third bandpass filter;

wherein the group delay time ratio $T_2/T_1$ is selected to be substantially equal to $M-1$, if M is an integer greater than 2; whereby the phase difference between a sinusoidal input signal present at said input terminal and the resultant sinusoidal output signal present at said output terminal is constant for small deviations in the frequency of said input signal.

10. A bandpass filter circuit comprising:

an input terminal for receiving an input signal;

a first frequency multiplier means operatively connected to said input terminal;

an oscillator means for providing a sinusoidal output signal;

a second frequency multiplier means operatively connected to said oscillator means;

a first multiiplier means operatively connected to the outputs of said first and second frequency multiplier means for producing sum and difference frequency components of the outputs of said first and second frequency multiplier means;

a first bandpass filter operatively connected to the output of said first multiplier means for extracting the difference frequency component from the output of said first multiplier means;

a second bandpass filter operatively connected to the output of said first bandpass filter;

a second multiplier means operatively connected to the output of said oscillator means and said first bandpass filter means for producing sum and difference frequency components of the outputs of said oscillator means and said first bandpass filter means;

first and second frequency divider means operatively connected respectively to the outputs of said second bandpass filter and said second multiplier means, a third multiplier means operatively connected to the outputs of said first and second frequuency divider means for producing sum and difference frequency components of the outputs of said first and second frequency divider means;

a third bandpass filter operatively connected to the output of said third multiplier means for extracting the difference frequency component from the output of said third multiplier means;

an output terminal operatively connected to the output of said third bandpass filter means for outputting the output of said third bandpass filter;

wherein the multiplication ratio of the first frequency multiplier means is selected to be equal to the division ratio of the first frequency divider means and the multiplication ratio of the second frequency multiplier means is selected to be equal to the division ratio of the second frequency divider means and the inherent phase variation between the input and the output of the first bandpass filter is selected to be equal to the inherent phase variation between the input and the output of the second bandpass filter; whereby the phase difference between a sinusoidal input signal present at said input terminal and the resultant sinusoidal output signal present at said output terminal is constant for small deviations in the frequency of said input signal.

11. A bandpass filter circuit comprising:

an input terminal for receiving an input signal;

a first bandpass filter operatively connected to said input terminal and having a group delay time $T_1$;

a first delay line operatively connected to the output of said first bandpass filter and having a group delay time $T_2$;

a frequency divider operatively connected to the output of said first delay line and having a frequency dividing ratio $1/N$;

a multiplier means operatively connected to the output of said first bandpass filter and said frequency divider for producing sum and difference frequency components of the outputs of said first bandpass filter and said divider means;

a second bandpass filter operatively connected to the output of said multiplier means for extracting the difference frequency components from the output of said multiplier means;

an output terminal operatively connected to the output of second bandpass filter means for outputting the output of said second bandpass filter means;

wherein the group delay time ratio $T_2/T_1$ is selected to be substantially equal to N-1 if N is an integer; whereby the phase difference between a sinusoidal input signal present at said input terminal and the resultant sinusoidal output signal present at said output terminal is constant for small deviations in the frequency of said input signal;

12. A bandpass filter circuit comprising:

a input terminal for receiving an input signal;

first and second bandpass filters operatively connected to said input terminal;

a frequency multiplier operatively connected to the output of said second bandpass filter and having a frequency multiplication ratio M;

a multiplier means operatively connected to the outputs of said first bandpass filter and said frequency multiplier for producing sum and difference frequency components of the outputs of said first bandpass filter and said multiplier means;

a third bandpass filter operatively connected to the output of said multiplier means for extracting the difference frequency component from the output of said multiplier means;

an output terminal operatively connected to the output of said third bandpass filter means for outputting the output of said third bandpass filter;

wherein the group delay time ratio of the first bandpass filter to the second bandpass filter is selected to be substantially equal to the multiplication ratio M of said multiplier means; whereby the phase difference between a sinusoidal input signal present at said input terminal and the resultant sinusoidal output signal present at said output terminal is constant for small deviations in the frequencies of said input signal.

* * * * *